(12) United States Patent
James et al.

(10) Patent No.: US 8,453,841 B1
(45) Date of Patent: Jun. 4, 2013

(54) DISK PLACEMENT AND STORAGE ASSEMBLY WITH DISK CASSETTE AND DISK SLOTTER

(75) Inventors: Frankie James, Kuching (MY); Kwok Lim Tay, Kuching (MY)

(73) Assignee: Western Digital Technologies, Inc., Irvine, CA (US)

( * ) Notice: Subject to any disclaimer, the term of this patent is extended or adjusted under 35 U.S.C. 154(b) by 11 days.

(21) Appl. No.: 12/429,079

(22) Filed: Apr. 23, 2009

(51) Int. Cl.
*B65D 85/00* (2006.01)

(52) U.S. Cl.
USPC .... 206/711; 206/710; 206/308.1; 206/387.15

(58) Field of Classification Search
USPC ........... 206/711, 710, 308.1, 387.15; 414/275
See application file for complete search history.

(56) References Cited

U.S. PATENT DOCUMENTS

| | | | |
|---|---|---|---|
| 4,669,612 A | 6/1987 | Mortensen | |
| 5,348,151 A | 9/1994 | Dressen | |
| 5,476,176 A | 12/1995 | Gregerson et al. | |
| 5,704,494 A | 1/1998 | Nishikiori et al. | |
| 5,720,387 A * | 2/1998 | Young | 206/308.1 |
| 5,833,067 A * | 11/1998 | Joshi | 206/454 |
| 5,853,214 A | 12/1998 | Babbs et al. | |
| 5,921,397 A | 7/1999 | Whalen | |
| 6,220,438 B1 | 4/2001 | Hirohata et al. | |
| 6,540,467 B1 * | 4/2003 | Zohni et al. | 414/275 |
| 6,577,578 B1 | 6/2003 | Nakamichi | |
| 6,691,876 B2 | 2/2004 | Tsai et al. | |
| 6,779,667 B2 * | 8/2004 | Nigg et al. | 206/711 |
| 6,902,059 B2 | 6/2005 | Whalen et al. | |
| 6,951,284 B2 | 10/2005 | Cheesman et al. | |
| 7,131,176 B2 | 11/2006 | Eggum | |
| 7,252,199 B2 | 8/2007 | Johnson et al. | |
| 7,347,329 B2 | 3/2008 | Burns et al. | |
| 7,584,851 B2 * | 9/2009 | Hong et al. | 206/589 |

FOREIGN PATENT DOCUMENTS

| | | | | |
|---|---|---|---|---|
| JP | 09-237798 | * | 2/1996 | 21/50 |

\* cited by examiner

*Primary Examiner* — J. Gregory Pickett
*Assistant Examiner* — Raven Collins (57) ABSTRACT

A disk placement and storage assembly for storage of disks includes a disk cassette and a disk slotter. The disk cassette includes a pair of side wall portions spanning between a pair of end portions, defining a disk receiving region. The side wall portions include a plurality of vertical slots for holding the disks. The disk slotter includes a top plate having a plurality of horizontal slots spanning across top surfaces of the disk cassette when the disk slotter is releasably coupled to the disk cassette, each one of the horizontal slots arranged and dimensioned to receive a disk as the disk is inserted through a horizontal slot in the disk slotter and into a pair of laterally opposing vertical slots of the disk cassette, each one of the plurality of horizontal slots located above and aligned with a pair of laterally opposing vertical slots in the disk cassette.

21 Claims, 6 Drawing Sheets

DISK PLACEMENT AND STORAGE ASSEMBLY WITH DISK CASSETTE AND DISK SLOTTER

BACKGROUND

Substrate carriers configured for holding multiple hard disk substrates during fabrication and shipping are well known in the data storage device industry. Examples of such prior art carriers are described in U.S. Pat. Nos. 5,921,397; 5,704,494; 4,669,612; and 5,348,151, each of which is hereby fully incorporated herein by reference.

During processing of hard disks using known prior art carriers or cassettes, a typical practice involves mechanical polishing of the disks at various polishing stations. Typically, handling of the disk carriers or cassettes during various fabrication processing steps is generally automated. A relatively high degree of precision in carrier or cassette positioning is desirable to minimize disk damage and particulate generation from improper indexing of the robotic tooling. Prior art carriers or cassettes, while offering a generally workable degree of precision in positioning, are still sometimes mispositioned, resulting in disk damage or excessive particulates in the processing environment. In addition, certain aspects of the mechanical polishing process require the manual loading of each individual disk into the prior art carriers or cassettes.

As with many disk handling processes, however, unloading and loading disks into cassettes may cause damage to the disks. Such damage may render one or more disks unusable, thereby reducing production yield and increasing manufacturing cost. One substantial cause of disk damage stems from the insertion of disks into the narrow slots of the cassette. Due to several factors, including the thinness of the disks and the close proximity of the slots, it is likely that a disk may be incorrectly inserted into the cassette. For example, a disk could be inadvertently placed into an occupied slot. The placement of a disk into an occupied slot may likely cause damage to both the disk being inserted and to the disk residing in the slot.

For example, a manual polishing station requires an operator to manually load disks that have been polished into disk cassettes. The operator must aim and align the individual disk before inserting it vertically into the disk cassette for storage or transportation. The manual handling of the disks often yields poor quality disks due to disk-to-disk contact. It would, therefore, be desirable to develop an apparatus and method to prevent damage to disks while inserting a disk into a cassette. What is needed in the industry is a disk storage assembly including a disk cassette and a disk slotter that addresses the above-identified deficiencies in the prior art carriers or cassettes.

DETAILED DESCRIPTION

Figure 1:
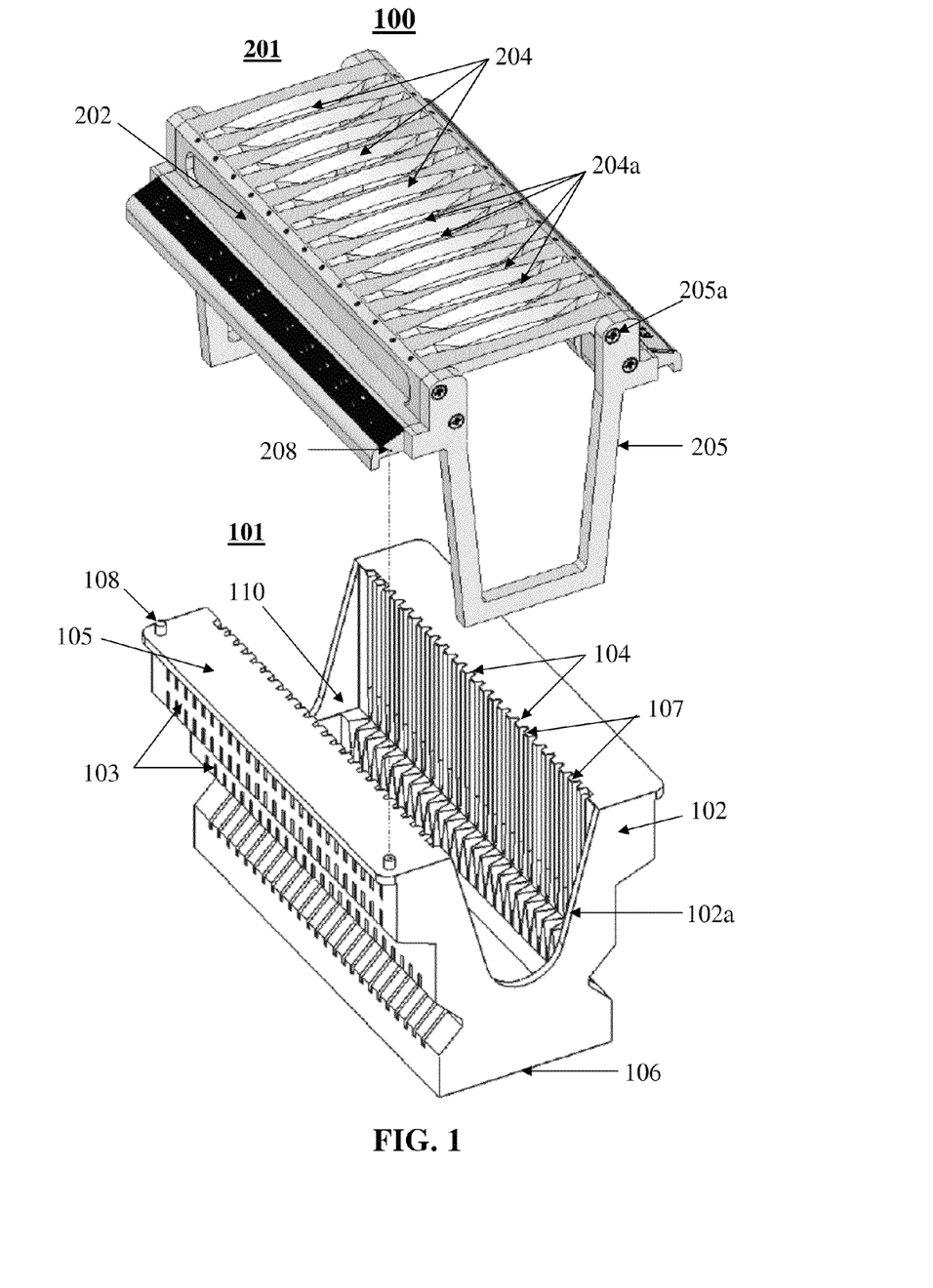
FIG. 1 is a perspective, schematic view illustrating a disk storage assembly according to one embodiment.

A disk storage assembly 100 as illustrated in FIG. 1 includes a disk cassette 101 and a disk slotter 201. Embodiments of the invention may be used in manufacturing disks into hard disks for computer memory storage. Embodiments of the invention may also be used to store wafers or substrates for use in the semiconductor fabrication industry.

The disk storage assembly 100 reduces disk-to-disk contact and related disk surface and outside diameter (OD) damage due to the disk drop action. The disk storage assembly 100 is well-suited for manual post-polished disk loading into a double spacing interval. The double spacing interval comes about, for example, by utilizing a 13-slot disk slotter 201 to place disks into every other disk slot 104a in a 25-slot disk cassette 101.

Figure 2:
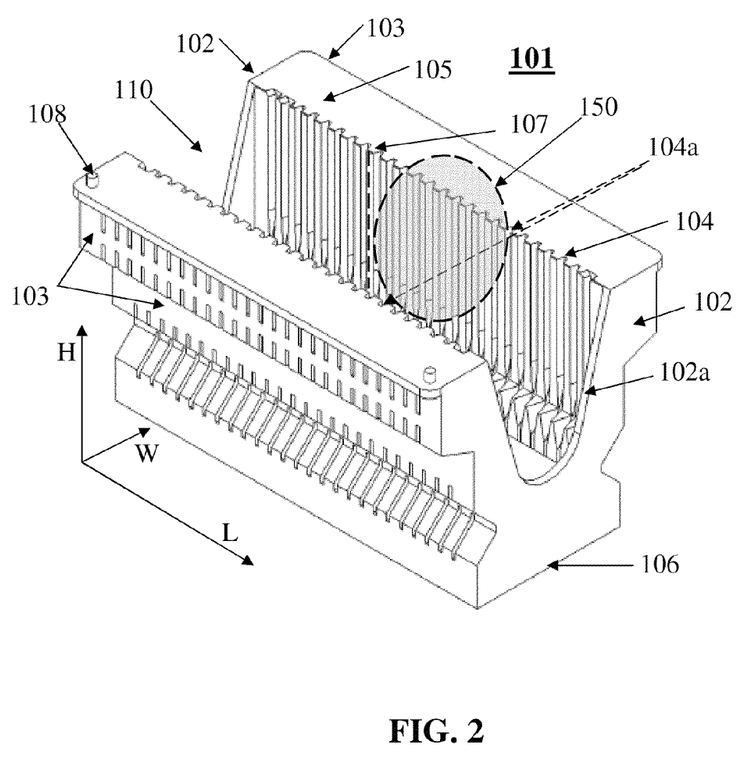
FIG. 2 is a perspective, schematic view illustrating a disk cassette according to one embodiment.

Referring to FIG. 2, the disk cassette 101 includes a pair of opposing end portions 102 and a pair of opposing side wall portions 103 spanning between the end portions 102, defining a disk receiving region 110. The side wall portions 103 also include a plurality of ribs 107 defining a plurality of laterally opposing vertical slots 104 which in combination form a corresponding plurality of horizontal slots 104a (cassette slots) for holding the disks 150.

As shown in FIG. 2, disk cassette 101 may be a vertically-loaded cassette, i.e. disk cassette 101 may be designed to allow disks 150 to be loaded in a manner that disks 150 are perpendicular to a base 106 of the cassette 101. The dimensions of disk cassette 101 may include length "L" (herein after defined as parallel to an axial direction), width "W" (herein after defined as parallel to a lateral direction), and height "H" (herein after defined as parallel to a vertical direction). In general, width and height may depend on the size of disks 150 while length may depend on the number of disks the cassette is capable of holding.

Disks sizes vary, but sizes currently used as hard disk substrates may be approximately 65 millimeter (mm) and 95 mm diameter disks for example. Wafers used in the semiconductor fabrication industry may be approximately 200-mm and 300-mm diameter disks for example. As such, width and height may be slightly larger than approximately the 65 mm or 95 mm depending on what size disk the cassette is designed to hold. For wafers, width and height may be slightly larger than approximately 200 mm or approximately 300 mm depending on what size wafer the cassette is designed to hold. The disk and wafer sizes described above are merely illustrative of various industry recognized standard sizes. However, it should be appreciated by those skilled in the art that embodiments of the present invention are not limited to any specific size disk, wafer, or substrate.

Alternatively, width and height may also depend on other dimensional features of disk cassette 101. For example, the dimensions of width and height may depend on sidewall thickness and/or base support dimensions.

As stated above, the length of disk cassette 101 may depend on the number of disks 150 the cassette 101 is capable of holding. Disk cassette 101 preferably includes vertical slots 104 for holding disks 150. An array of vertical slots 104 may extend along all or a portion of length of disk cassette 101. The number of slots may vary, but is generally approximately 25 slots for 25 disks for disk cassettes 101 that carry 65 mm, 95 mm or 200-mm disks and generally about 10 disks for disk cassettes 101 that carry 300-mm disks.

Each cassette slot 104a is preferably designed to contain a single disk 150. As such, the size of each of cassette slot 104a may be slightly larger than the size of a disk 150. More specifically, the width of cassette slots 104a may be approximately 2 mm or approximately 3 mm larger than the diameter of disks 150. Larger and smaller cassette slot widths, however, may be appropriate depending on the design specifications of the disk cassette 101.

In addition, the pitch of cassette slots 104a may be approximately 1.5 times to approximately 2.0 times greater than the width of disks 150. Pitch, also referred to as center to center slot spacing, may be the distance from the centerline of one slot to the centerline of an adjacent slot. In an embodiment, the pitch of cassette slots 104a may be between approximately 6.35 mm for disks and 2.0 mm to approximately 4.0 mm for wafers. However, larger or smaller pitch dimensions may be used depending on the design specifications of the disk cassette 101. In some embodiments, cassette slots 104a may also include tapered edges to more clearly outline the distinction of each individual slot 104a.

Referring to FIGS. 1 and 3-5, the disk slotter 201 may be positioned above the disk cassette 101. The disk slotter 201 utilizes a horizontal slot 204 as an interface to receive and register the outside diameter (OD) of a disk 150 to improve disk registration and reduce disk-to-disk contact as the disks 150 are dropped into and through the disk slotter 201 into the disk cassette 101.

The 13-slot disk slotter 201 includes a top plate 202 that may be releasably coupled to a top portion 105 of the disk cassette 101. The top plate 202 includes thirteen horizontal slots 204 spanning across top surfaces 105 of the opposing side wall portions 103 of the disk cassette 101. Each one of the thirteen horizontal slots 204 is arranged and dimensioned to receive a disk 150 as the disk 150 is inserted through the horizontal slot 204 in the disk slotter 201 and into a pair of laterally opposing vertical slots 104 defining a cassette slot 104a of the disk cassette 101. Each one of the thirteen horizontal slots 204 is located above and aligned with a pair of laterally opposing vertical slots 104 defining a cassette slot 104a. Each horizontal slot 204 is formed by a pair of horizontal ribs 204a that span across top surfaces 105 of the opposing side wall portions 103 of the disk cassette 101. The horizontal slots 204 may be approximately hexagonal shaped 204b or elliptical shaped 204c.

Figure 3:
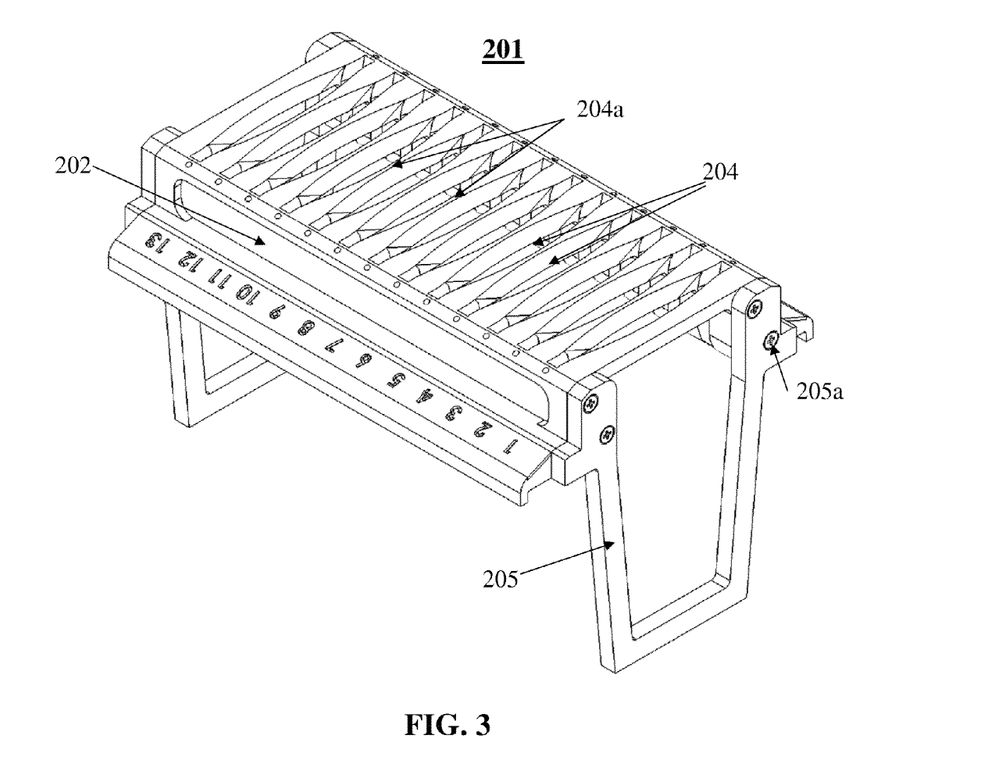
FIG. 3 is a perspective, schematic view illustrating a disk slotter according to one embodiment.
Figure 4:
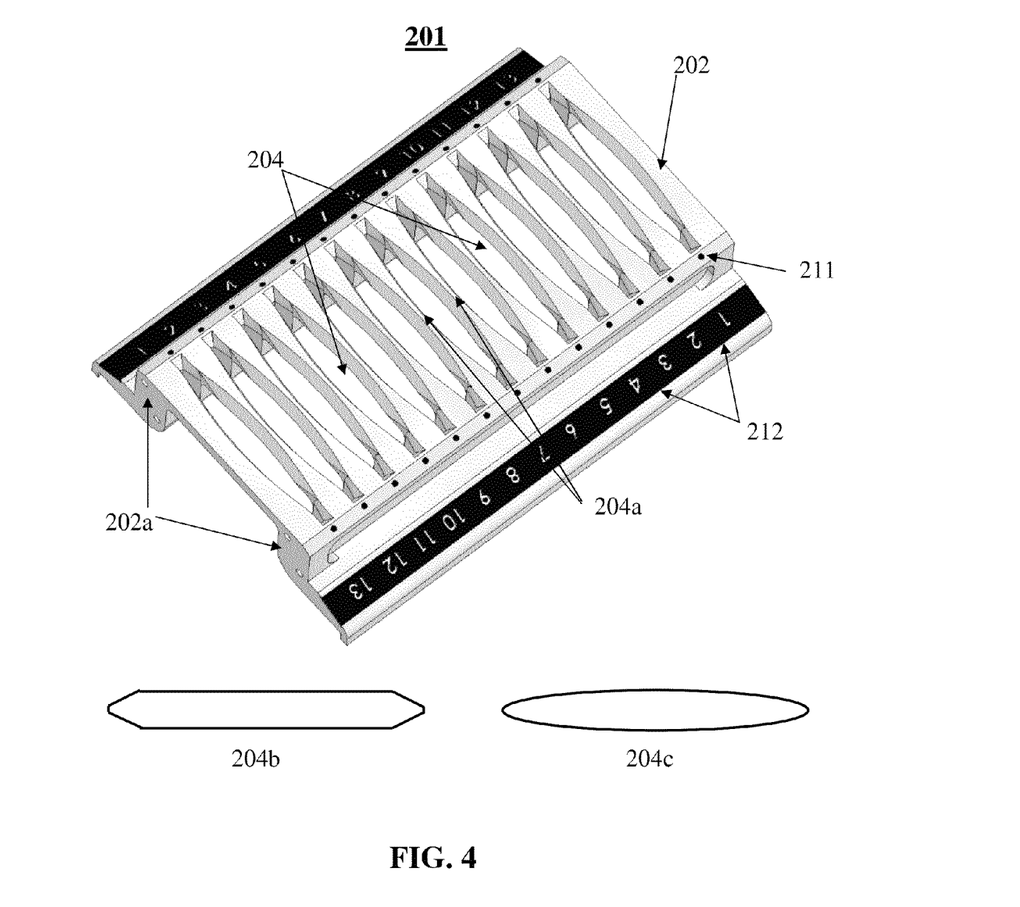
FIG. 4 is a perspective, schematic view illustrating a disk slotter according to one embodiment.
Figure 5:
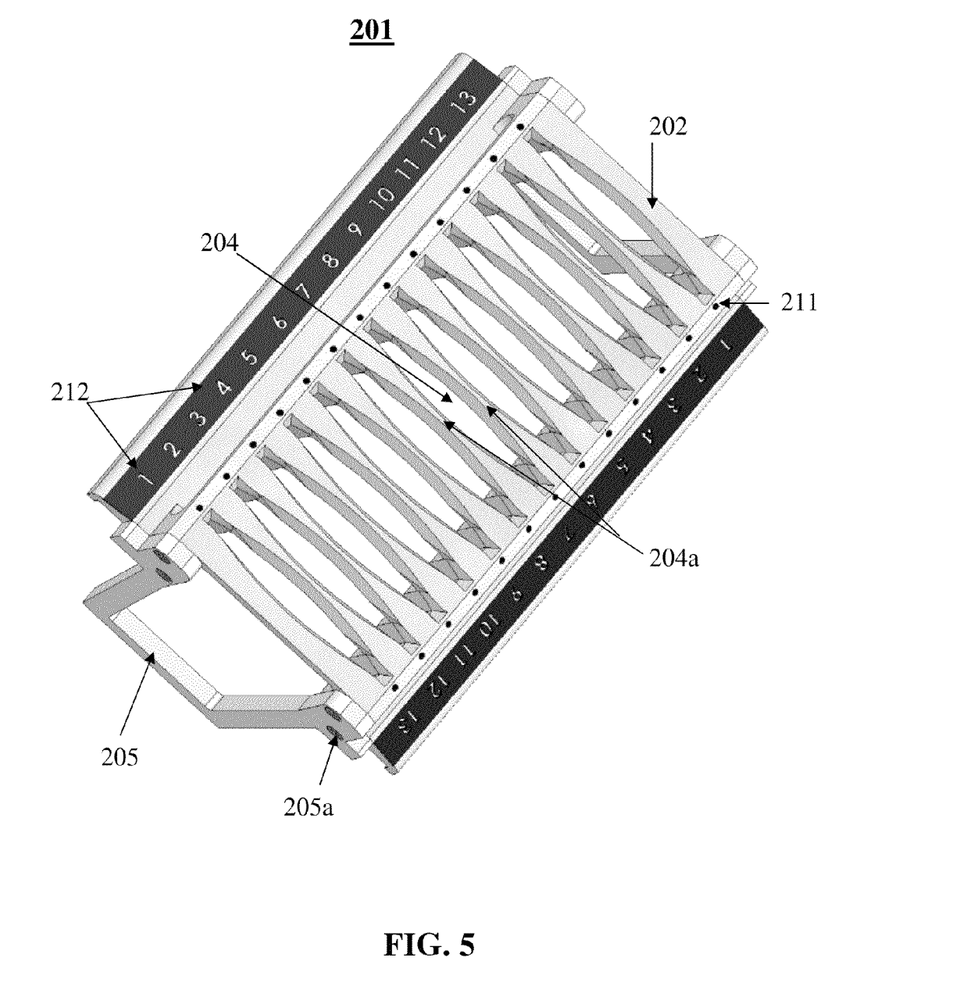
FIG. 5 is a perspective, schematic view illustrating a disk slotter according to one embodiment.

Each horizontal slot 204 may be identified with a corresponding slot number 212 that may be printed or embossed on outer top edges of top plate 202. In addition, each horizontal slot 204 may be marked with alignment marks 211 that may be printed or embossed on interior top edges of top plate 202.

As shown in FIGS. 1 and 2, an embodiment of the disk cassette 101 comprises two opposing side walls 103 and two opposing end walls 102 forming an interior 110 to enclose and house a plurality of disks 150 therein, a top surface 105 defining a top opening, and a bottom base 106 defining a bottom opening. The side walls 103 have a plurality of disk confining ribs 107 and a plurality of slot portions 104 that define cassette slots 104a to secure the disks 150 in the interior 110 of the disk cassette 101. An industry standard is to house 25 disks. The end walls 102 each have an ingress or U-shaped contoured top 102a to access the disks.

As shown in FIGS. 1 and 3-5, the disk slotter 201 is configured and arranged to align with and attach to the top surface 105 of disk cassette 101 and cover the top opening and end wall ingresses. The disk slotter 201 releasably couples to the disk cassette 101 using a pair of registration pins 108 formed on the top surface 105 of the disk cassette 101 that mate with a pair of registration holes formed in a bottom surface of top plate 202 of disk slotter 201. The disk slotter 201 may have two opposing U-shaped alignment bars 205, each joined along an upper edge 202a of the disk slotter top plate 202 using screws 205a. The two opposing U-shaped alignment bars 205 allow access to the two end wall 102a ingresses of disk cassette 101. Each U-shaped alignment bar 205 may make a slip fit contact with a corresponding U-shaped end wall 102 of disk cassette 101. This slip fit contact may occur between both U-shaped alignment bars 205 and the corresponding end walls 102 of disk cassette 101. As those skilled in the art are aware, this connection may also include various additional locking mechanisms such as a catch, a latch, or cooperating tab and slot.

The disk cassette 101 and disk slotter 201 including the top plate 202 and alignment bars 205 may each be manufactured from a molded polymer. The molded polymer may be comprised of at least one of the polymers from the group of polymers consisting of a polycarbonate, a polypropylene, or a polyester.

In a preferred embodiment, the molded polymer is Polyoxymethylene (POM), also commonly known under DuPont's brand name as Delrin. Delrin is an engineering plastic, a polymer with the chemical formula $-(-O-CH_2-)_n-$. Delrin is often marketed and used as a metal substitute. Delrin is a lightweight, low-friction, and wear-resistant thermoplastic with good physical and processing properties and capable of operating in temperatures in excess of 90 degrees Celsius (approximately 200 degrees Fahrenheit).

Delrin is also known as polyacetal, acetal resin, polytrioxane, polyformaldehyde, and paraformaldehyde (the latter term is usually restricted to the short-chained polymer). Polyacetals are sold under the trade names Delrin, Kepital, Celcon, Hostaform, Iupital and Ultraform, the last five being copolymers.

Insertion of a disk 150 or wafer into a designated horizontal slot 204 of disk slotter 201 may be achieved by several methods. For example, a manual method of insertion may be by use a forefinger and a thumb. An automated method of insertion may be by a clamping tool designed to grasp wafers at their edges. In some cases, it may be advantageous to design horizontal slots 204 to be large enough to accommodate the width of a clamping tool or a couple of fingers while still preventing the insertion of a disk 150 or wafer into adjacent slots. A large enough opening may provide additional clearance around designated horizontal slot 204 such that a disk 150 or wafer may be inserted with less precision than inserting a disk 150 or wafer in an opening that is approximately the same size as an underlying designated cassette slot 104a. Regardless of size and shape, horizontal slot 204 is preferably designed not to be a source of potential damage to wafer 150 or wafers. Horizontal slot 204 may be approximately hexagonal shaped 204b or elliptical shaped 204c. Horizontal slot 204 may have beveled edges or chamfers as well.

Figure 6:
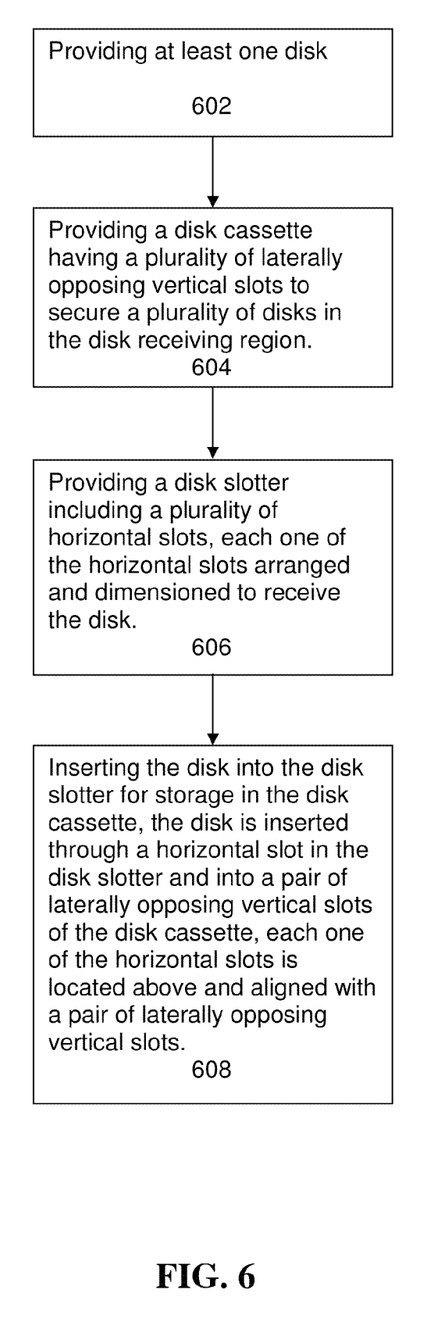
FIG. 6 is a block diagram illustrating a method of storing a disk using the disk storage assembly according to one embodiment.

FIG. 6 illustrates a method of inserting a disk 150 or wafer into a designated horizontal slot 204 of disk slotter 201 as the disk 150 is dropped into and through the disk slotter 201 into the disk cassette 101. The method begins with act 602 providing at least one disk 150 to be stored. Act 604 includes providing a disk cassette 101 having a pair of axially opposing end portions 102 and a pair of laterally opposing side wall portions 103 spanning between the end portions 102, the end portions 102 and the side wall portions 103 defining a disk receiving region 110, each of the side wall portions 103 having a plurality of laterally opposing vertical slots 104 to secure a plurality of disks 150 in the disk receiving region 110, the vertical slots 104 being formed on interior surfaces of the opposing side wall portions 103, a pair of a plurality of pairs of vertical slots 104 arranged and dimensioned to receive the disk 150.

Act 606 includes providing a disk slotter 201 including a top plate 202 releasably coupled to a top portion 105 of the disk cassette 101, wherein the top plate 202 includes a plurality of horizontal slots 204 spanning across top surfaces 105 of the opposing side wall portions 103, each one of the horizontal slots 204 arranged and dimensioned to receive the disk 150.

Act 608 includes inserting the disk 150 into the disk slotter 201 for storage in the disk cassette 101, the disk 150 is inserted through a horizontal slot 204 in the disk slotter 201 and into a pair of laterally opposing vertical slots 104 of the disk cassette 101, each one of the horizontal slots 204 is located above and aligned with a pair of laterally opposing vertical slots 104.

It should be appreciated by those with skill in this art that, although embodiments of the invention have been previously described with reference to particular disk storage systems, that the embodiments of the invention may be utilized with a wide variety of differing types of disk, wafer, or substrate storage systems having different types of disks, wafers, substrates etc., and that the details disclosed in describing the embodiments of the invention are not intended to limit the scope of the invention as set forth in the appended claims.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

We claim:

1. A disk placement and storage assembly, comprising:
   a disk cassette for storing a plurality of disks, said disk cassette includes a pair of axially opposing end portions and a pair of laterally opposing side wall portions spanning between said end portions, said end portions and said side wall portions defining a disk receiving region, each of said side wall portions having a plurality of laterally opposing vertical slots to secure said plurality of disks in said disk receiving region, said vertical slots being formed on interior surfaces of said opposing side wall portions, a pair of a plurality of pairs of vertical slots arranged and dimensioned to receive a disk; and
   a disk slotter including a top plate releasably coupled to a top portion of said disk cassette, wherein the top plate includes a plurality of horizontal slots spanning across top surfaces of said opposing side wall portions at a spaced interval that corresponds to non-consecutive vertical slots in the disk cassette, each one of said horizontal slots arranged and dimensioned with a shaped opening that provides additional clearance on both sides of the disk to accommodate the disk while it is gripped manually or by a tool and to receive the disk as the disk is inserted through the horizontal slot in the disk slotter and into a pair of laterally opposing vertical slots of the disk cassette, each one of said plurality of horizontal slots is located above and aligned with a pair of laterally opposing vertical slots, wherein the disk slotter further includes a pair of axially opposing alignment bars attached to the top plate to align the disk slotter to the disk cassette when the disk slotter is releasably coupled to the disk cassette, and wherein the alignment bars are U-shaped.

2. The disk slotter of claim 1, wherein the horizontal slots are approximately hexagonal shaped or elliptical shaped.

3. The disk slotter of claim 1, wherein the plurality of horizontal slots includes 13 slots.

4. The disk slotter of claim 1, wherein the center to center spacing of each slot of the plurality of horizontal slots is approximately equal to 12.7 mm.

5. The disk slotter of claim 2, wherein a major axis of each hexagonal shaped slot or elliptical shaped slot is approximately equal to 76.2 mm.

6. The disk slotter of claim 2, wherein the plurality of hexagonal shaped slots or elliptically shaped slots are graphically labeled by numbers one through thirteen on a top surface of the top plate.

7. The disk slotter of claim 2, wherein a major axis of each hexagonal shaped slot or elliptical shaped slot is graphically labeled by alignment marks on a top surface of the top plate.

8. The disk slotter of claim 1, wherein the top plate and alignment bars are each manufactured from a molded polymer.

9. The disk slotter of claim 8 wherein the molded polymer is comprised of at least one of the polymers from the group of polymers consisting of polycarbonate, polypropylene, and polyester.

10. The disk slotter of claim 1, wherein the top plate and alignment bars are each manufactured from Polyoxymethylene (Delrin).

11. A disk slotter for use in aligning and inserting disks into a disk cassette, comprising:
    a top plate having a plurality of horizontal slots spanning across top surfaces of opposing side wall portions of said disk cassette at a spaced interval that corresponds to non consecutive vertical slots in the disk cassette when said disk slotter is releasably coupled to said disk cassette, each one of said horizontal slots arranged and dimensioned with a shaped opening that provides additional clearance on both sides of the disk to accommodate the disk while it is gripped manually or by a tool and to receive a disk as the disk is inserted through the horizontal slot in the disk slotter and into a pair of laterally opposing vertical slots of the disk cassette, each one of said plurality of horizontal slots located above and aligned with a pair of laterally opposing vertical slots in said disk cassette; and
    a pair of opposing alignment bars attached to the top plate to align the disk slotter to the disk cassette when the disk slotter is releasably coupled to the disk cassette, wherein the alignment bars are U-shaped.

12. The disk slotter of claim 11, wherein the horizontal slots are approximately hexagonal shaped or elliptical shaped.

13. The disk slotter of claim 11, wherein the plurality of horizontal slots includes 13 slots.

14. The disk slotter of claim 11, wherein the center to center spacing of each slot of the plurality of horizontal slots is approximately equal to 12.7 mm.

15. The disk slotter of claim 12, wherein a major axis of each hexagonal shaped slot or elliptical shaped slot is approximately equal to 76.2 mm.

16. The disk slotter of claim 11, wherein the plurality of horizontal slots are graphically labeled by numbers one through thirteen on a top surface of the top plate.

17. The disk slotter of claim 12, wherein a major axis of each hexagonal shaped slot or elliptical shaped slot is graphically labeled by alignment marks on a top surface of the top plate.

18. The disk slotter of claim 11, wherein the top plate and alignment bars are each manufactured from a molded polymer.

19. The disk slotter of claim 18, wherein the molded polymer is comprised of at least one of the polymers from the group of polymers consisting of polycarbonate, polypropylene, and polyester.

20. The disk slotter of claim 11, wherein the top plate and alignment bars are each manufactured from Polyoxymethylene (Delrin).

21. A method of using a disk slotter to accurately place a disk into a disk cassette, comprising:
   providing at least one disk;
   providing a disk cassette having a pair of axially opposing end portions and a pair of laterally opposing side wall portions spanning between said end portions, said end portions and said side wall portions defining a disk receiving region, each of said side wall portions having a plurality of laterally opposing vertical slots to secure said plurality of disks in said disk receiving region, said vertical slots being formed on interior surfaces of said opposing side wall portions, a pair of a plurality of pairs of vertical slots arranged and dimensioned to receive the disk;
   providing a disk slotter including a top plate releasably coupled to a top portion of said disk cassette, wherein the top plate includes a plurality of horizontal slots spanning across top surfaces of said opposing side wall portions at a spaced interval that corresponds to non-consecutive vertical slots in the disk cassette, each one of said horizontal slots arranged and dimensioned with a shaped opening that provides additional clearance on both sides of the disk to accommodate the disk while it is gripped manually or by a tool and to receive the disk, wherein the disk slotter further includes a pair of axially opposing alignment bars attached to the top plate to align the disk slotter to the disk cassette when the disk slotter is releasably coupled to the disk cassette and wherein the alignment bars are U-shaped; and
   inserting the at least one disk into the disk slotter for storage in the disk cassette, the at least one disk is inserted through a horizontal slot in the disk slotter and into a pair of laterally opposing vertical slots of the disk cassette, each one of said horizontal slots located above and aligned with a pair of laterally opposing vertical slots.

* * * * *